US009257916B2

(12) United States Patent
Cheng et al.

(10) Patent No.: US 9,257,916 B2
(45) Date of Patent: Feb. 9, 2016

(54) POWER INVERTERS WITH MULTIPLE INPUT CHANNELS

(71) Applicant: CyboEnergy, Inc., Rancho Cordova, CA (US)

(72) Inventors: George Shu-Xing Cheng, Folsom, CA (US); Steven L. Mulkey, Cameron Park, CA (US)

(73) Assignee: CyboEnergy, Inc., Rancho Cordova, CA (US)

( * ) Notice: Subject to any disclaimer, the term of this patent is extended or adjusted under 35 U.S.C. 154(b) by 0 days.

(21) Appl. No.: 14/299,705

(22) Filed: Jun. 9, 2014

(65) Prior Publication Data

US 2014/0285024 A1    Sep. 25, 2014

Related U.S. Application Data

(62) Division of application No. 12/837,162, filed on Jul. 15, 2010, now Pat. No. 8,786,133.

(60) Provisional application No. 61/226,141, filed on Jul. 16, 2009.

(51) Int. Cl.
*H02J 1/00* (2006.01)
*H02M 7/44* (2006.01)
*H01L 31/02* (2006.01)
*H02M 7/49* (2007.01)
*H04B 3/54* (2006.01)
*H02J 3/38* (2006.01)

(52) U.S. Cl.
CPC ........... *H02M 7/44* (2013.01); *H01L 31/02021* (2013.01); *H02J 3/383* (2013.01); *H02J 3/387* (2013.01); *H02M 7/49* (2013.01); *H04B 3/54* (2013.01); *H02J 3/385* (2013.01); *H02J 2001/004* (2013.01); *Y02E 10/563* (2013.01); *Y10T 307/707* (2015.04)

(58) Field of Classification Search
CPC ............ H02M 7/44; H02M 7/49; H04B 3/54; H02J 3/387; H02J 3/383; H02J 3/385; H02J 2001/004; H01L 31/02021; Y10T 307/707; Y02E 10/563
See application file for complete search history.

(56) References Cited

U.S. PATENT DOCUMENTS

| 5,903,116 | A | 5/1999 | Geis |
| 6,031,294 | A | 2/2000 | Geis |
| 6,055,524 | A | 4/2000 | Cheng |
| 6,111,767 | A * | 8/2000 | Handleman ............... G05F 1/67 136/293 |

(Continued)

FOREIGN PATENT DOCUMENTS

| JP | 09275637 | 10/1997 |
| JP | 2001-008383 | 1/2001 |

OTHER PUBLICATIONS

Rashid H. Muhammad, Power Electronics Handbook, 2007, Academic Press.

(Continued)

*Primary Examiner* — Daniel Cavallari
(74) *Attorney, Agent, or Firm* — DLA Piper LLP (US)

(57) ABSTRACT

A method and apparatus is disclosed for intelligently inverting DC power from DC sources such as photovoltaic (PV) solar modules to single-phase or three-phase AC power to feed the power grid for electricity generation. A power inverter with multiple input channels or input ports that can connect to multiple DC sources is disclosed.

8 Claims, 15 Drawing Sheets

(56) References Cited

U.S. PATENT DOCUMENTS

| | | |
|---|---|---|
| 6,192,668 B1 | 2/2001 | Mackay |
| RE37,126 E | 4/2001 | Peng |
| 6,265,786 B1 | 7/2001 | Bosley |
| 6,325,142 B1 | 12/2001 | Bosley |
| 6,360,131 B1 | 3/2002 | Cheng |
| 6,381,944 B2 | 5/2002 | Mackay |
| 6,487,096 B1 | 11/2002 | Gilbreth |
| 6,495,929 B2 | 12/2002 | Bosley |
| 6,556,980 B1 | 4/2003 | Cheng |
| 6,612,112 B2 | 9/2003 | Gilbreth |
| 6,684,112 B1 | 1/2004 | Cheng |
| 6,684,115 B1 | 1/2004 | Cheng |
| 6,784,565 B2 | 8/2004 | Wall |
| 6,870,279 B2 | 3/2005 | Gilbreth |
| 6,958,550 B2 | 10/2005 | Gilbreth |
| 6,960,840 B2 | 11/2005 | Willis |
| 7,016,743 B1 | 3/2006 | Cheng |
| 7,142,626 B2 | 11/2006 | Cheng |
| 7,152,052 B2 | 12/2006 | Cheng |
| 7,415,446 B2 | 8/2008 | Cheng |
| 7,710,077 B2 | 5/2010 | Zeng et al. |
| 8,102,074 B2 | 1/2012 | Hadar |
| 8,860,241 B2 | 10/2014 | Hadar |
| 8,933,321 B2 | 1/2015 | Hadar |
| 2001/0043052 A1 | 11/2001 | Griffey et al. |
| 2001/0052704 A1 | 12/2001 | Bosley |
| 2002/0073713 A1 | 6/2002 | Mackay |
| 2002/0099476 A1 | 7/2002 | Hamrin |
| 2002/0166324 A1 | 11/2002 | Willis |
| 2003/0007369 A1 | 1/2003 | Gilbreth |
| 2003/0111103 A1 | 6/2003 | Bower |
| 2004/0103669 A1 | 6/2004 | Willis |
| 2004/0119291 A1 | 6/2004 | Hamrin |
| 2004/0135436 A1 | 7/2004 | Gilbreth |
| 2004/0264225 A1 | 12/2004 | Bhavaraju |
| 2007/0040532 A1 | 2/2007 | Bae et al. |
| 2008/0050349 A1 | 2/2008 | Stewart |
| 2008/0111517 A1 | 5/2008 | Pfeifer |
| 2008/0283118 A1 | 11/2008 | Rotzoll |
| 2009/0000654 A1 | 1/2009 | Rotzoll |
| 2009/0159113 A1 | 6/2009 | Morimoto |
| 2009/0160258 A1 | 6/2009 | Allen et al. |
| 2009/0174259 A1 | 7/2009 | Lin et al. |
| 2010/0127570 A1* | 5/2010 | Hadar ............... H04B 3/548 307/77 |
| 2010/0202177 A1 | 8/2010 | Kajouke |
| 2010/0231045 A1 | 9/2010 | Collins et al. |
| 2010/0237703 A1 | 9/2010 | Stern |
| 2011/0012430 A1 | 1/2011 | Cheng |
| 2011/0084556 A1 | 4/2011 | Marroquin et al. |
| 2011/0148195 A1 | 6/2011 | Lee |
| 2011/0231456 A1 | 9/2011 | Choi |
| 2011/0273022 A1 | 11/2011 | Dennis |
| 2012/0025618 A1 | 2/2012 | Erickson |
| 2012/0104872 A1 | 5/2012 | Marroquin |
| 2012/0138123 A1 | 6/2012 | Newdoll |
| 2012/0212065 A1 | 8/2012 | Cheng et al. |
| 2012/0235631 A1 | 9/2012 | Nakashima et al. |
| 2012/0259437 A1 | 10/2012 | Cheng et al. |
| 2012/0313443 A1 | 12/2012 | Cheng et al. |
| 2012/0319495 A1 | 12/2012 | Müller et al. |
| 2013/0002031 A1 | 1/2013 | Mulkey et al. |
| 2014/0252862 A1 | 9/2014 | Cheng et al. |
| 2014/0265584 A1 | 9/2014 | Cheng et al. |

OTHER PUBLICATIONS

Maniktala, Sanjaya., "Switching Power Supplies A to Z," Elsevier, 2006.

International Search Report issued in PCT/US2010/042123 mailed Feb. 22, 2011.

Written Opinion issued in PCT/US2010/042123 mailed Feb. 22, 2011.

R. Jones. "The Measurement of Lumped Parameter Impedence: A Metrology Guide," University of Michigan, Jan. 1974.

International Preliminary Report on Patentability issued in PCT/US2010/042123 on Jan. 26, 2012.

U.S. Appl. No. 12/837,162.

U.S. Appl. No. 13/397,402.

U.S. Appl. No. 13/537,206.

U.S. Appl. No. 13/493,622.

International Search Report and Written Opinion issued in PCT/US2012/041923 on Jan. 17, 2013.

U.S. Appl. No. 13/789,637.

U.S. Appl. No. 13/844,484.

U.S. Appl. No. 13/846,708.

International Search Report issued in PCT/US2014/030888 dated Aug. 20, 2014.

English Language Abstract and Translation for JP 2001-008383 published Jan. 12, 2001.

U.S. Appl. No. 14/625,375.

U.S. Appl. No. 14/630,502.

* cited by examiner

POWER INVERTERS WITH MULTIPLE INPUT CHANNELS

This application is a divisional of U.S. application Ser. No. 12/837,162 filed on Jul. 15, 2010 which is herein incorporated by reference. This application claims priority to U.S. Provisional Application No. 61/226,141, filed on Jul. 16, 2009, which is herein incorporated by reference.

The subject of this patent relates to direct current (DC) to alternating current (AC) power inverters that invert DC power from single or multiple DC power sources to single-phase or three-phase AC power, where the DC power source includes but is not limited to photovoltaic (PV) solar modules, fuel cells, batteries, and other DC power generators. More particularly, this patent relates to a method and apparatus that can intelligently invert DC power from single or multiple DC sources to single-phase or three-phase AC power to feed the power grid with both optimal efficiency and system scalability. The inventive smart and scalable power inverters include a novel and unique scalable design so that the DC to AC power inversion system can include as few as one inverter and one DC source, up to a selected number of inverters and multiple DC sources. A number of smart single-input, dual-input, triple-input, quad-input, and multiple-input power inverters in a mixed variety can easily connect to single, dual, triple, quad, and multiple DC power sources, invert the DC power to AC power, and daisy chain together to generate a total power, which is equal to the summation of the AC power supplied by each smart and scalable power inverter.

In the following, we will use a photovoltaic (PV) solar power system as an example to describe this invention. Traditionally, in a PV solar power system, the DC output from each solar module is combined in a DC junction box. The final DC output from the DC junction box is connected to a large centralized DC-AC power inverter to generate electricity. Using a centralized power inverter includes the following shortcomings:

1. If the inverter fails, the entire solar power generation system shuts down;
2. The centralized power inverter requires a large space to install, generates excessive heat and noise, and can be costly;
3. Since the performance of the entire solar power system is dictated by the performance of the weakest solar module, power production is negatively affected by non-uniformity of solar modules, sunlight variations or partial shading due to clouds, trees, dust on the panel, etc.;
4. The Maximum Power Point Tracking (MPPT) can only be applied to a system level, not to each solar module;
5. A lot of design and installation effort must be made to assure the solar modules are properly oriented in respect to each other;
6. The DC power output from each solar module has to be wired to a DC power junction box causing the wiring to be costly and labor intensive; and
7. Expensive large gauge DC power cables have to be used to connect the junction box and the centralized power inverter to avoid excessive power loss.

The smart and scalable power inverters described in this patent overcome these shortcomings and provide great scalability and flexibility to easily and cost-effectively install a photovoltaic solar power system with optimal power generation efficiency.

The term "mechanism" is used herein to represent hardware, software, or any combination thereof.

DESCRIPTION

Figure 1:
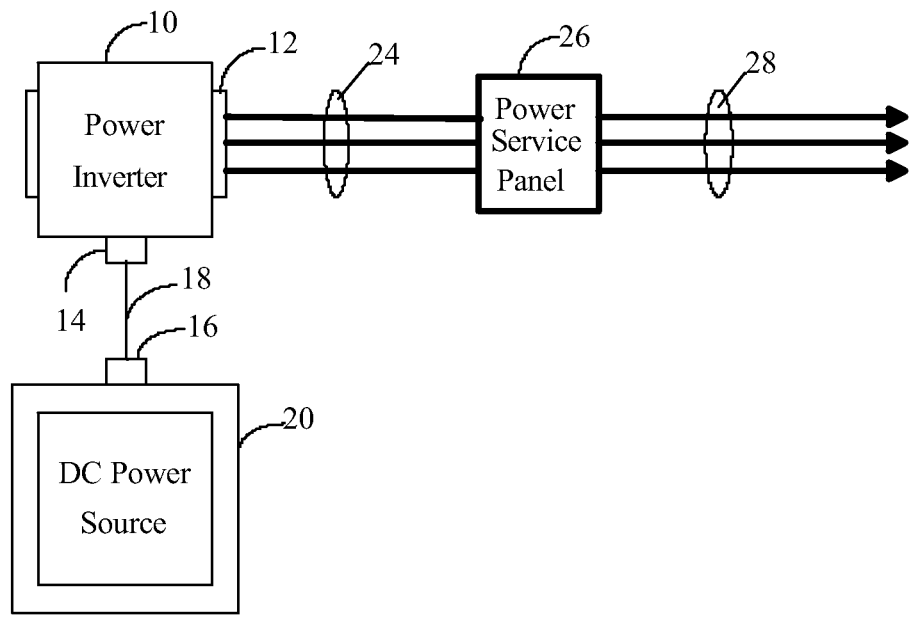
FIG. 1 is a block diagram illustrating a smart single-input power inversion and optimization system where one power inverter inverts the DC power from one DC source to single-phase AC power.

FIG. 1 is a block diagram illustrating a smart single-input power inversion and optimization system where one power inverter inverts the DC power from one DC source to single-phase AC power. The system comprises one power inverter 10, one DC power source such as a solar module 20, an inverter's AC power output port 12, an inverter's DC power port 14, a DC source's DC power connector 16, a DC power cable 18, a single-phase AC powerline 24, a power service panel 26, and the power grid 28. This is the simplest case of the DC to AC power inversion and optimization system, where one DC to AC power inverter connects to a DC source on one end, inverts the DC power to single-phase AC power, and outputs the AC power to the power grid 28 via the AC powerline 24 and the power service panel 26. If the DC source is a photovoltaic (PV) solar module, this can be considered a personal solar power system that could be potentially installed by a knowledgeable homeowner, provided certain permits are obtained.

Figure 2:
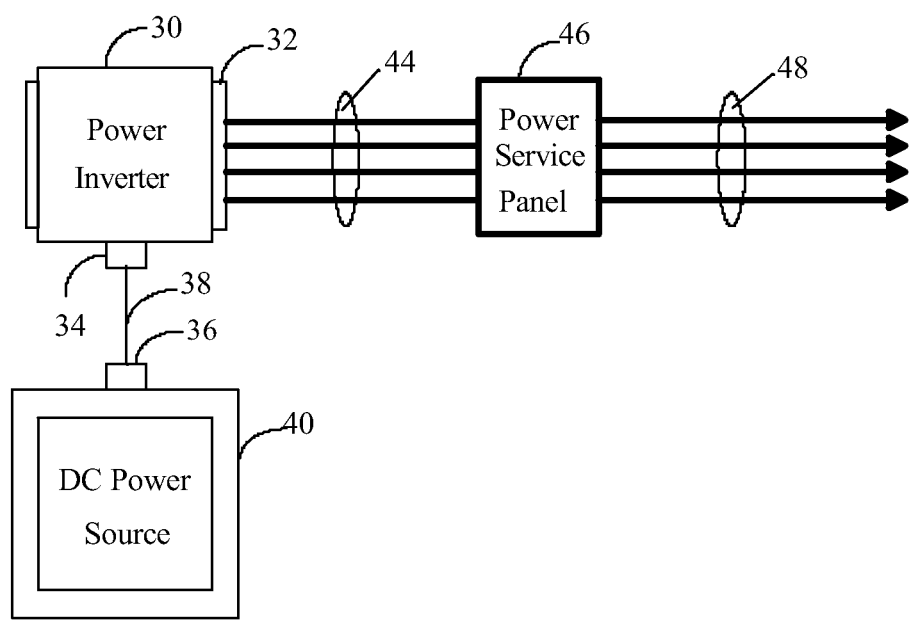
FIG. 2 is a block diagram illustrating a smart single-input three-phase power inversion and optimization system where one power inverter inverts the DC power from one DC source to three-phase AC power.

FIG. 2 is a block diagram illustrating a smart single-input three-phase power inversion and optimization system where one power inverter inverts the DC power from one DC source to three-phase AC power. The system comprises one power inverter 30, one DC power source such as a solar module 40, an inverter's AC power output port 32, an inverter's DC power port 34, a DC power connector of the DC source 36, a DC power cable 38, a three-phase AC powerline 44, a three-phase power service panel 46, and the three-phase power grid 48. The DC to AC power inverter connects to a DC source on one end, inverts the DC power to three-phase AC power, and outputs the AC power to the power grid 48 via AC powerline 44 and power service panel 46.

Figure 3:
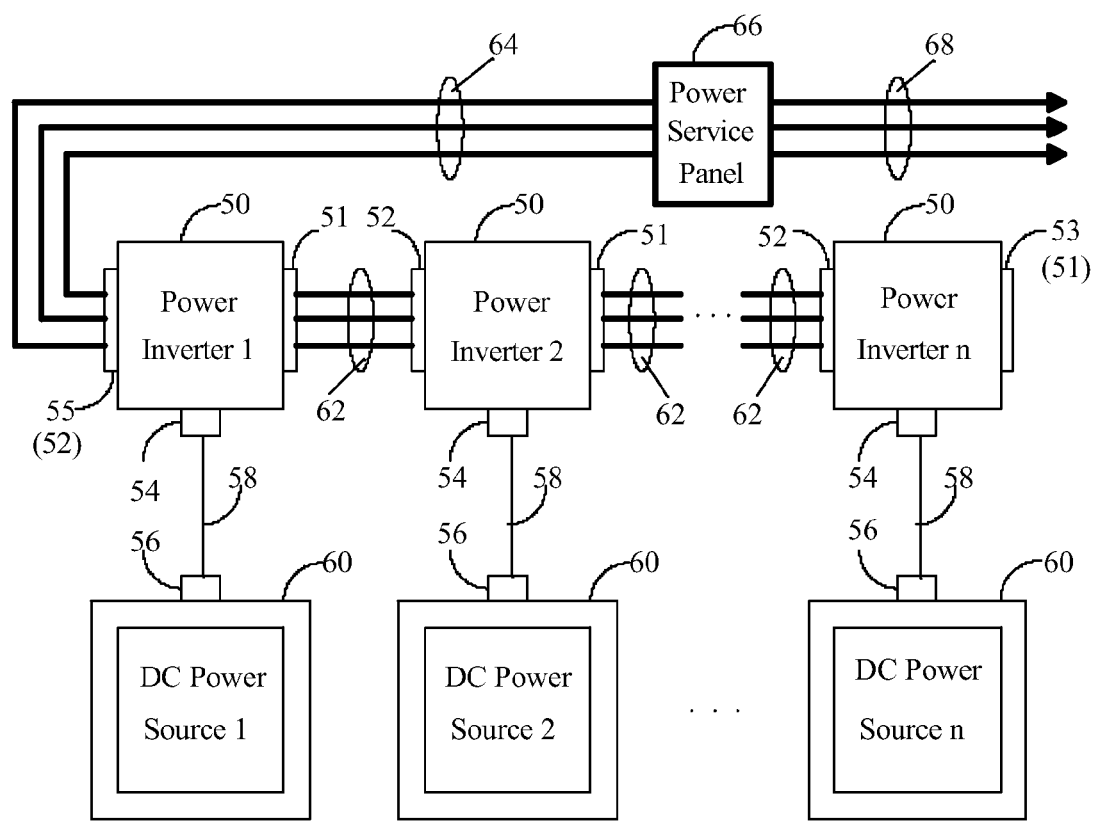
FIG. 3 is a block diagram illustrating a smart single-input power inversion and optimization system where two or more smart power inverters daisy chain, each of which inverts the DC power from one DC source to single-phase AC power.

FIG. 3 is a block diagram illustrating a smart single-input power inversion and optimization system where two or more power inverters daisy chain, each of which inverts the DC power from one DC source to single-phase AC power. The system comprises n smart power inverters 50 and the same number of DC power sources 60. Each smart power inverter comprises an AC power input port 51, an AC power output port 52, and a DC power port 54. Each DC power source such as a solar module 60 comprises a DC power connector 56 and is connected to its corresponding power inverter via a DC power cable 58, respectively. All the smart power inverters 50 daisy chain, where the first power inverter's AC input port 53 is left open, and the last power inverter's AC output port 55 is connected to a power service panel 66 via the single-phase AC powerline 64. The AC power generated by the system is supplied to the power grid 68.

Throughout this document, n=1, 2, 3, . . . , as an integer. Based on the design of the smart and scalable power inverter, there could be a limit to the actual number of inverters that can daisy chain. This is because the total generated AC current cannot exceed the limit of the connected branch circuit breaker in the power service panel. For each power service panel, multiple branch circuits can be added based on the desired power generation requirements of the application.

Without losing generality, let us say n=16 as an example. That means, 16 smart power inverters can daisy chain, where the AC output port of a smart power inverter connects to the AC input port of the next smart power inverter, and so on. The first power inverter's AC input port is left open, and the last power inverter's AC output port is connected to an AC power service panel so that the generated AC power can be sent to the power grid. This method greatly simplifies the wiring job when installing a PV solar power system.

Although we say the power inverters daisy chain, where the output port of each power inverter is connected to the input port of the next power inverter, the actual connection of the inverters is pass-through. That means, the generated AC power from each power inverter is added in parallel onto the AC powerline. In this scheme, a defective or low-producing power inverter will not interfere with other power inverters that are able to generate usable AC power. A defective or low-producing power inverter will be switched off automatically by a solid-state switch mechanism in the inverter. Therefore, unless the AC powerline is broken, all the healthy power inverters on the AC powerline will continue to work.

Figure 4:
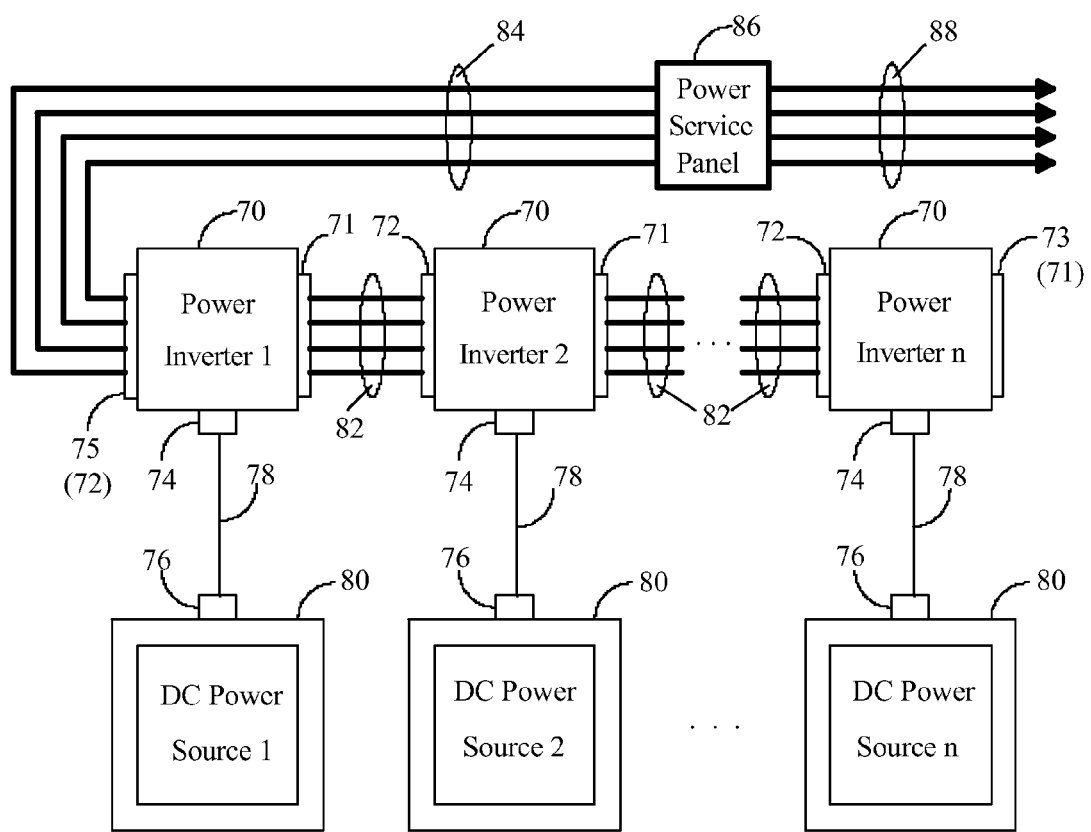
FIG. 4 is a block diagram illustrating a smart single-input three-phase power inversion and optimization system where two or more smart power inverters daisy chain, each of which inverts the DC power from one DC source to three-phase AC power.

FIG. 4 is a block diagram illustrating a smart single-input three-phase power inversion and optimization system where two or more power inverters daisy chain, each of which inverts the DC power from one DC source to three-phase AC power. The system comprises n smart power inverters 70 and the same number of DC power sources 80. Each smart power inverter comprises an AC power input port 71, an AC power output port 72, and a DC power port 74. Each DC source such as a solar module 80 comprises a DC power connector 76 and is connected to its corresponding power inverter via a DC power cable 78, respectively. All the smart power inverters 70 daisy chain, where the first power inverter's AC input port 73 is left open, and the last power inverter's AC output port 75 is connected to a three-phase power service panel 86 via the three-phase AC powerline 84. The AC power generated by the system is supplied to the three-phase power grid 88.

Figure 5:
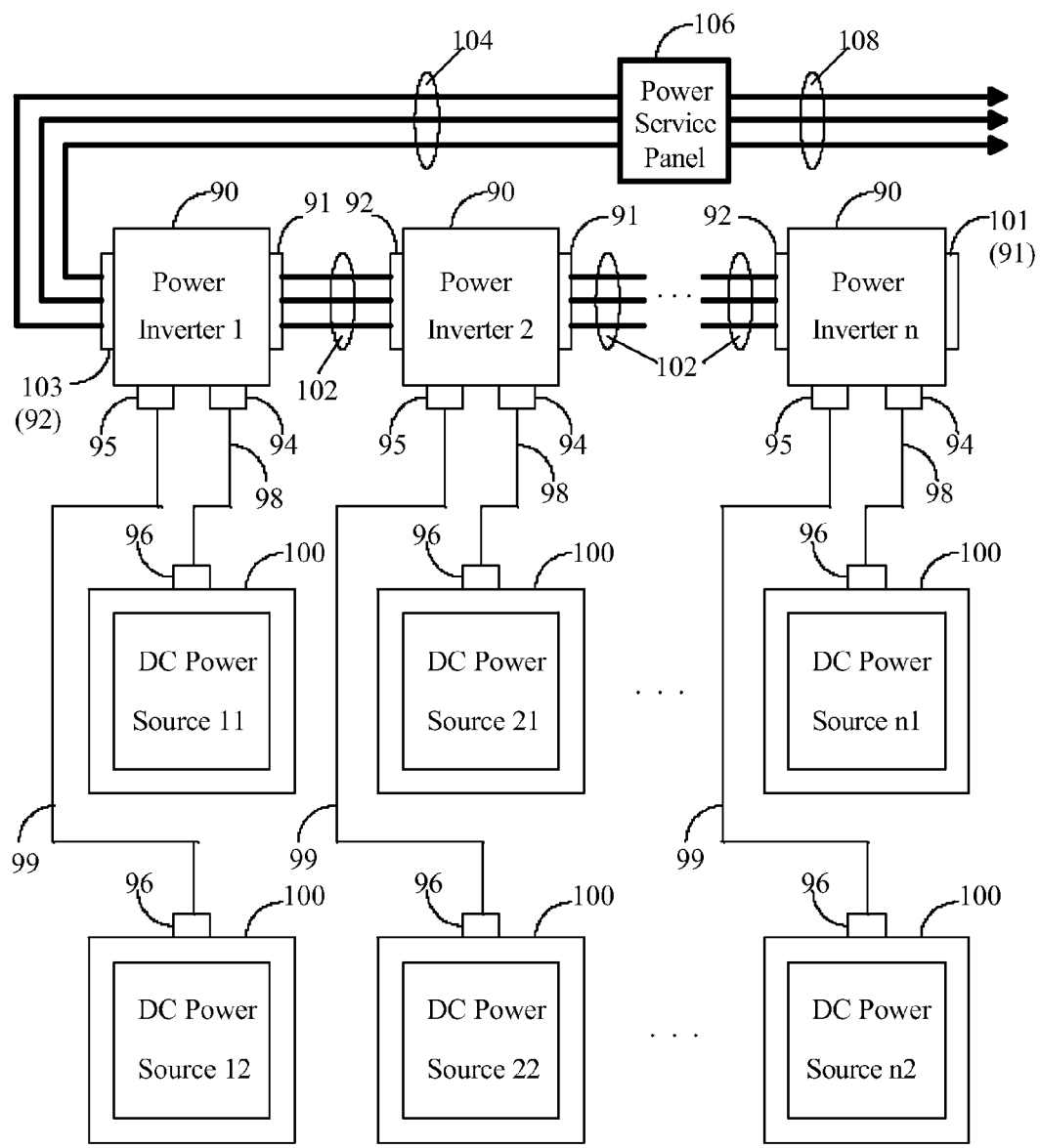
FIG. 5 is a block diagram illustrating a smart dual-input power inversion and optimization system where two or more smart power inverters daisy chain, each of which inverts the DC power from two DC sources to single-phase AC power.

FIG. 5 is a block diagram illustrating a smart dual-input power inversion and optimization system where two or more smart power inverters daisy chain, each of which inverts the DC power from two DC sources to single-phase AC power. The system comprises n smart dual-input power inverters 90 and two times more of the DC power sources 100, so the total number of DC power sources is 2×n (2 times n). Each DC power source such as a solar module 100 comprises a DC power connector 96. Each smart dual-input power inverter has two DC power ports 94 and 95 connecting to their corresponding DC sources via DC power cables 98 and 99, respectively. Each smart power inverter comprises an AC power input port 91 and an AC power output port 92. All the smart power inverters 90 daisy chain, where the first power inverter's AC input port 101 is left open, and the last power inverter's AC output port 103 is connected to a power service panel 106 via the single-phase AC powerline 104. The AC power generated by the system is supplied to the power grid 108.

Figure 6:
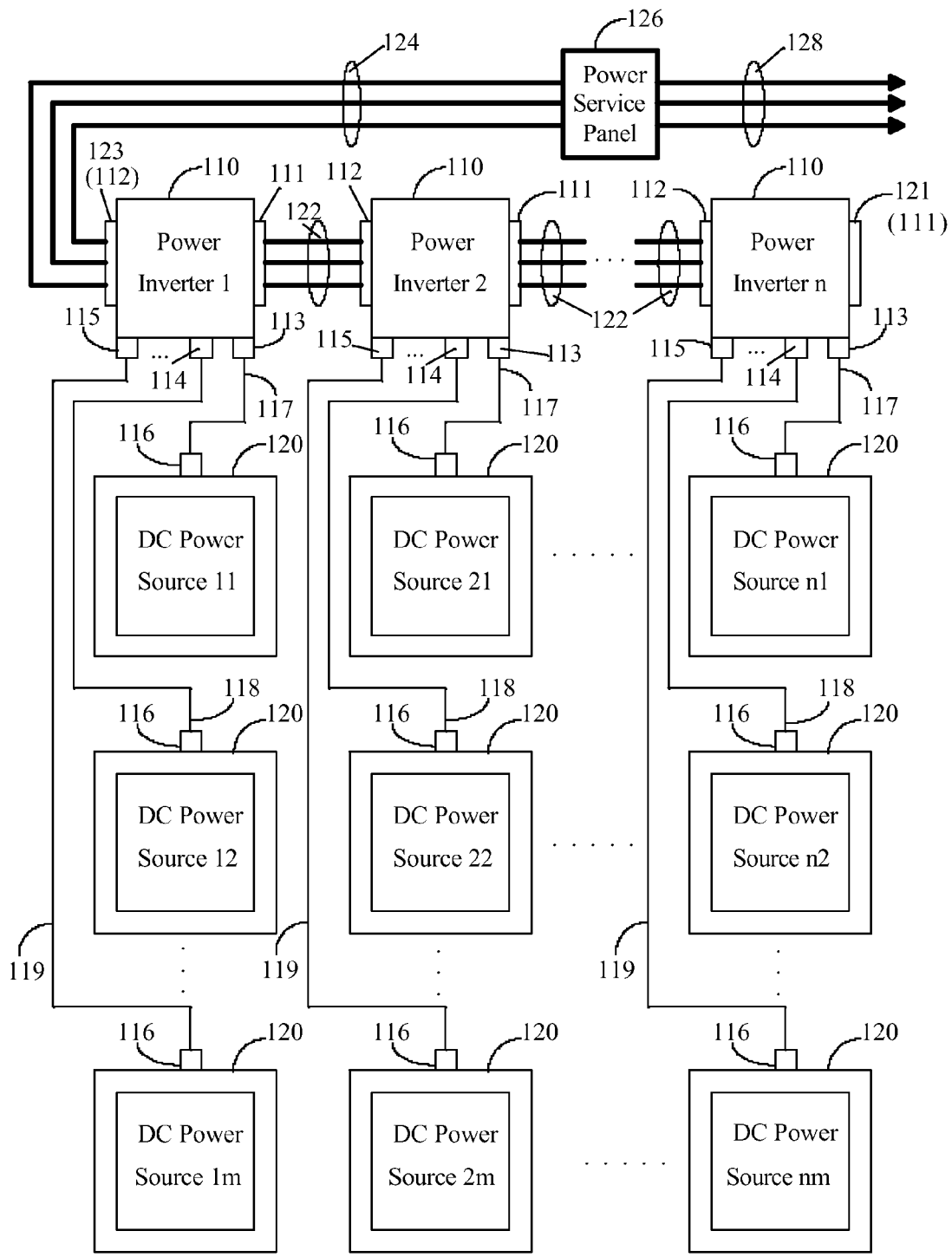
FIG. 6 is a block diagram illustrating a smart multi-input power inversion and optimization system where two or more smart power inverters daisy chain, each of which inverts the DC power from multiple DC sources to single-phase AC power.

FIG. 6 is a block diagram illustrating a smart multi-input power inversion and optimization system where two or more power inverters daisy chain, each of which inverts the DC power from multiple DC sources to single-phase AC power. Without losing generality, the system comprises n smart multi-input power inverters 110, each of which has multiple DC power input ports 113, 114, . . . , 115. Each DC source 120 has a DC power connector 116. For each smart multi-input power inverter, m DC sources 120 are connected to their corresponding power inverter via DC power cables 117, 118, . . . , 119, respectively. Each smart power inverter comprises an AC power input port 111 and an AC power output port 112. All the smart power inverters 110 daisy chain, where the first power inverter's AC input port 121 is left open, and the last power inverter's AC output port 123 is connected to a power service panel 126 via the single-phase AC powerline 124. The AC power generated by the system is supplied to the power grid 128. With this scalable scheme, there are n×m (n times m) DC power sources such as PV solar modules 120 in the system, where n is the total number of power inverters, and m is the total number of DC sources connected to each power inverter.

Throughout this document, m=1, 2, 3, . . . as an integer. The smart and scalable power inverter can be designed with single-input (m=1), dual-input (m=2), triple-input (m=3), quad-input (m=4), and so on. Practically, various smart power inverter products can be designed with a different number of inputs. They have to be practically useful, meet branch circuit limit requirements, and make economic sense depending on the applications. Since each smart multi-input power inverter can handle m DC power sources, it is much more cost effective than the one-on-one design where a power inverter is required for each DC source. In addition, n smart multi-input power inverters can daisy chain through their AC power ports so that the wiring job can be significantly reduced during the installation of the solar power system.

For multi-input power inverters, the actual number of inverters that can daisy chain is limited by the total power generated by all the DC sources connected in a sub-system for a specific branch circuit. In this configuration, there are a total n×m (n times m) DC sources. If a branch circuit can take the total power generated by 16 DC sources as an example, we can daisy chain 8 dual-input power inverters or 4 quad-input power inverters to meet this requirement. More branch circuits can always be added to a power service panel if there are a large number of DC sources in the system. In this case, the solar power system will include a number of sub-systems, each of which includes n×m DC sources, n smart and scalable power inverters, and one branch circuit.

Figure 7:
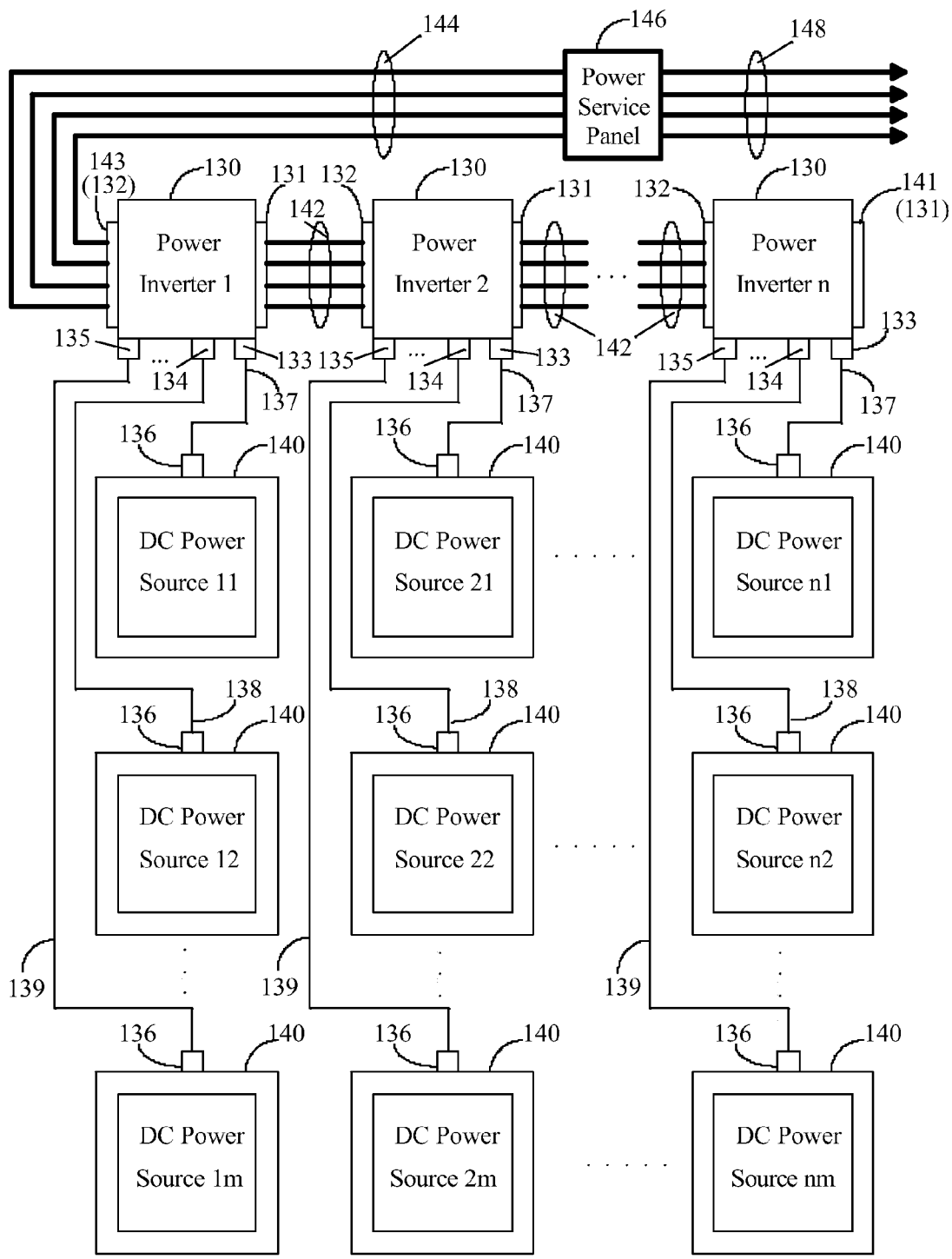
FIG. 7 is a block diagram illustrating a smart multi-input three-phase power inversion and optimization system where two or more smart power inverters daisy chain, each of which inverts the DC power from multiple DC sources to three-phase AC power.

FIG. 7 is a block diagram illustrating a smart multi-input three-phase power inversion and optimization system where two or more smart power inverters daisy chain, each of which inverts the DC power from multiple DC sources to three-phase AC power. Without losing generality, the system comprises n smart multi-input power inverters 130, each of which has m DC power input ports 133, 134, . . . , 135. Each DC power source 140 has a DC power connector 136. For each smart multi-input power inverter, m DC sources 140 are connected to their corresponding power inverter via DC power cables 137, 138, . . . , 139, respectively. Each smart power inverter comprises an AC power input port 131 and an AC power output port 132. The n smart power inverters 130 daisy chain, where the first power inverter's AC input port 141 is left open, and the last power inverter's AC output port 143 is connected to a power service panel 146 via the three-phase AC powerline 144. The AC power generated by the system is supplied to the three-phase power grid 148.

Figure 8:
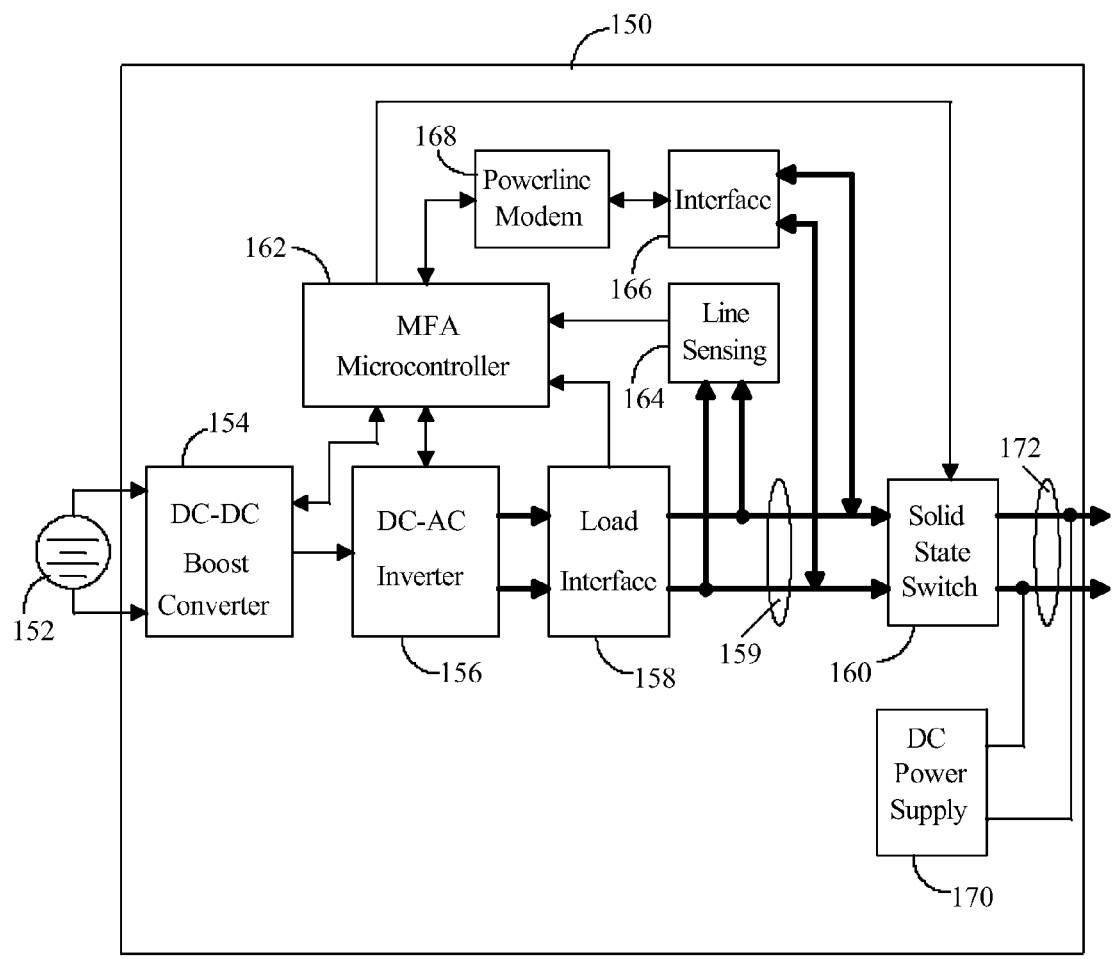
FIG. 8 is a block diagram illustrating a smart single-input power inverter that inverts the DC power from one DC source to single-phase AC power.

FIG. 8 is a block diagram illustrating a smart single-input power inverter that inverts the DC power from one DC source to single-phase AC power. The smart single-input power inverter 150 comprises a DC-DC boost converter 154, a DC-AC inverter 156, a load interface circuit 158, a solid-state switch circuit 160, an MFA microcontroller 162, a line sensing circuit 164, an interface circuit for powerline communications 166, a powerline communications Modem 168, and a DC power supply 170.

The MFA microcontroller 162 as well as the ones to be described in FIGS. 9, 10, 11, and 12 are small computers on a single integrated circuit (IC) or a set of ICs that consists of a central processing unit (CPU) combined with functions and peripherals including a crystal oscillator, timers, watchdog, serial and analog I/Os, memory modules, pulse-width-modulation (PWM) generators, and user software programs. A 32-bit high-performance floating-point microcontroller is selected for this application. The MFA microcontroller performs real-time control and optimization functions for the smart and scalable power inverter, in which Model-Free Adaptive (MFA) controllers are used to control the DC-DC boost converter, and MFA optimizers provide maximum power point tracking (MPPT) to allow the power inverter to achieve optimal power production. The MFA control and optimization technologies have been described in U.S. Pat. Nos. 6,055,524, 6,556,980, 6,360,131, 6,684,115, 6,684,112, 7,016,743, 7,142,626, 7,152,052, 7,415,446, related international patents, and other pending patents.

In FIG. 8, the power from a DC source 152 is delivered to a DC-DC boost converter 154. As an example, a standard 24V PV solar module will produce a usable DC power in the range of 24V to 40V DC up to 8 A. In order to produce commercial 240V AC power, the incoming DC voltage needs to be boosted to a minimal usable value such as 170V DC. Inductors, capacitors, diodes, switches, and controlled PWM (pulse width modulation) signals are used to perform the DC voltage boost. The DC power is then inverted to AC power with voltage larger than 240 VAC by the DC-AC inverter 156. The generated AC power goes through the load interface circuit 158 to be combined with the AC power in the internal AC powerline 159. The high frequency components of the generated AC power are being filtered by the load interface circuit 158. A solid-state switch 160 controlled by the MFA microcontroller 162 is used to isolate the internal AC powerline 159 from the external AC powerline 172 when solar power is not being generated. This way, consumption of AC power from the power grid by the solar power unit will be minimized during the non-generation time. A line sensing circuit 164 connected to the AC powerline 159 is used to detect the phase and zero-crossing point of the incoming AC power from the power grid. The phase and zero-crossing point signals are sent to the MFA microcontroller 162 for AC power synchronization to assure that the power inverter provides high quality synchronized power to the grid. A powerline communications Modem 168, which is isolated by an interface circuit 166, is used to establish a 2-way digital signal communication between the MFA microcontroller 162 and the outside world through the AC powerline. This way, no extra digital signal lines are needed since the digital signals are embedded inside the AC power signal. The external AC powerline 172 is tapped by a power supply 170 to supply DC power to the electronic components of the power inverter.

The MFA microcontroller 162 is used to perform a number of tasks including (i) monitoring the DC boost voltage, (ii) controlling the DC-DC boost converter, (iii) performing maximum power point tracking (MPPT), (iv) performing DC-AC inversion and AC power synchronization, (v) monitoring AC current and voltage for generated power amount and status, (vi) performing powerline communications, (vii) performing logic controls such as AC powerline switching and isolation.

Figure 9:
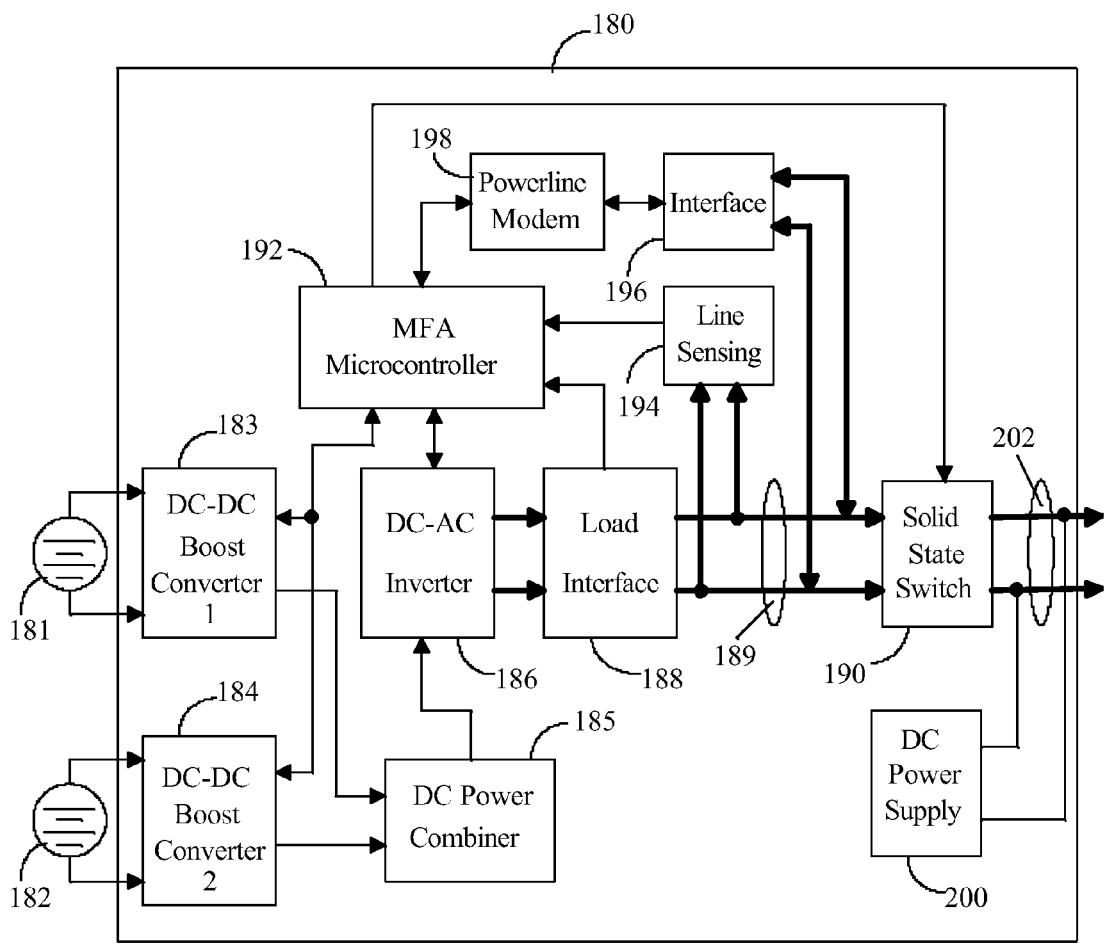
FIG. 9 is a block diagram illustrating a smart dual-input power inverter that inverts the DC power from two DC sources to single-phase AC power.

FIG. 9 is a block diagram illustrating a smart dual-input power inverter that inverts the DC power from two DC sources to single-phase AC power. The smart dual-input power inverter 180 comprises 2 DC-DC boost converters 183, 184, a DC power combiner 185, a DC-AC inverter 186, a load interface circuit 188, a solid-state switch circuit 190, an MFA microcontroller 192, a line sensing circuit 194, an interface circuit for powerline communications 196, a powerline communications Modem 198, and a DC power supply 200. The power from DC sources 181, 182 is delivered to the corresponding DC-DC boost converters 183, 184, respectively. The DC power is then combined in the DC power combiner 185. The total combined DC power is inverted to AC power with voltage larger than 240 VAC by the DC-AC inverter 186. The generated AC power goes through the load interface circuit 188 to be combined with the AC power in the internal AC powerline 189. A solid-state switch 190 controlled by the MFA microcontroller 192 is used to isolate the internal AC powerline 189 from the external AC powerline 202 when solar power is not being generated. A line sensing circuit 194 connected to the AC powerline 189 is used to detect the phase and zero-crossing point of the incoming AC power from the power grid. The phase and zero-crossing point signals are sent to the MFA microcontroller 192 for AC power synchronization to assure that the power inverter provides high quality synchronized power to the grid. A powerline communications Modem 198, which is isolated by an interface circuit 196, is used to establish a 2-way digital signal communication between the MFA microcontroller 192 and the outside world through the AC powerline. The external AC powerline 202 is tapped by a power supply 200 to supply DC power to the electronic components of the power inverter. The MFA microcontroller 192 is used to perform a number of tasks including (i) monitoring the DC boost voltage from each DC-DC boost converter, (ii) controlling the DC-DC boost converters, (iii) performing maximum power point tracking (MPPT) for each DC source, (iv) performing DC-AC inversion and AC power synchronization, (v) monitoring AC current and voltage for generated power amount and status, (vi) performing powerline communications, (vii) performing logic controls such as AC powerline switching and isolation.

Figure 10:
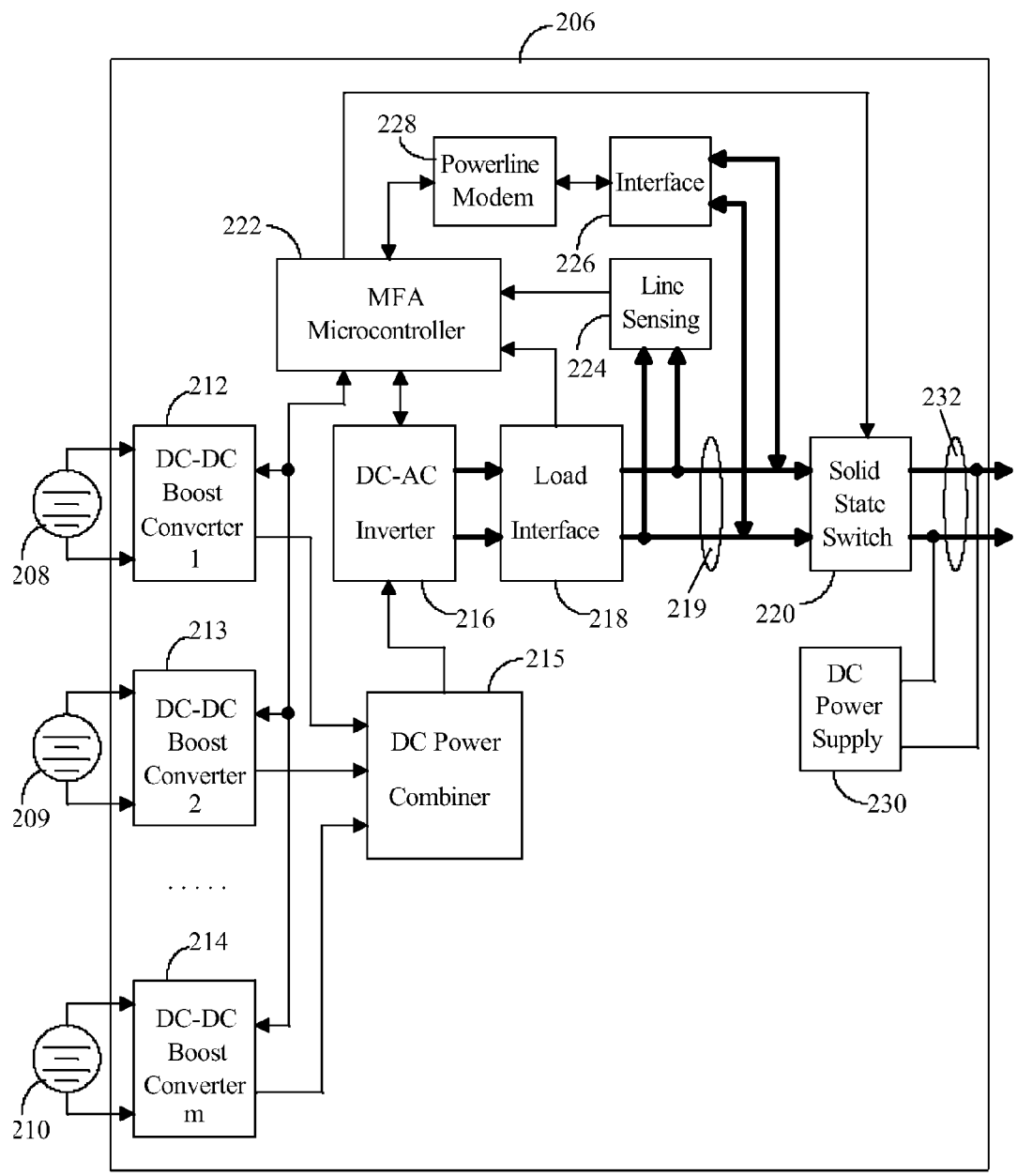
FIG. 10 is a block diagram illustrating a smart multi-input power inverter that inverts the DC power from multiple DC sources to single-phase AC power.

FIG. 10 is a block diagram illustrating a smart multi-input power inverter that inverts the DC power from multiple DC sources to single-phase AC power. The smart multi-input power inverter 206 comprises m DC-DC boost converters 212, 213, . . . , 214, a DC power combiner 215, a DC-AC inverter 216, a load interface circuit 218, a solid-state switch circuit 220, an MFA microcontroller 222, a line sensing circuit 224, an interface circuit for powerline communications 226, a powerline communications Modem 228, and a DC power supply 230. The power from DC sources 208, 209, . . . , 210 is delivered to the corresponding DC-DC boost converters 212, 213, . . . , 214, respectively. The DC power is then combined in the DC power combiner 215. The total combined DC power is inverted to AC power with voltage larger than 240 VAC by the DC-AC inverter 216. The generated AC power goes through the load interface circuit 218 to be combined with the AC power in the internal AC powerline 219. A solid-state switch 220 controlled by the MFA microcontroller 222 is used to isolate the internal AC powerline 219 from the external AC powerline 232 when solar power is not being generated. A line sensing circuit 224 connected to the AC powerline 219 is used to detect the phase and zero-crossing point of the incoming AC power from the power grid. The phase and zero-crossing point signals are sent to the MFA microcontroller 222 for AC power synchronization to assure that the power inverter provides high quality synchronized power to the grid. A powerline communications Modem 228, which is isolated by an interface circuit 226, is used to establish a 2-way digital signal communication between the MFA microcontroller 222 and the outside world through the AC powerline. The external AC powerline 232 is tapped by a power supply 230 to supply DC power to the electronic components of the power inverter. The MFA microcontroller 222 is used to perform a number of tasks including (i) monitoring the DC boost voltage from each DC-DC boost converter, (ii) controlling the DC-DC boost converters, (iii) performing maximum power point tracking (MPPT) for each DC source, (iv) performing DC-AC inversion and AC power synchronization, (v) monitoring AC current and voltage for generated power amount and status, (vi) performing powerline communications, (vii) performing logic controls such as AC powerline switching and isolation.

Figure 11:
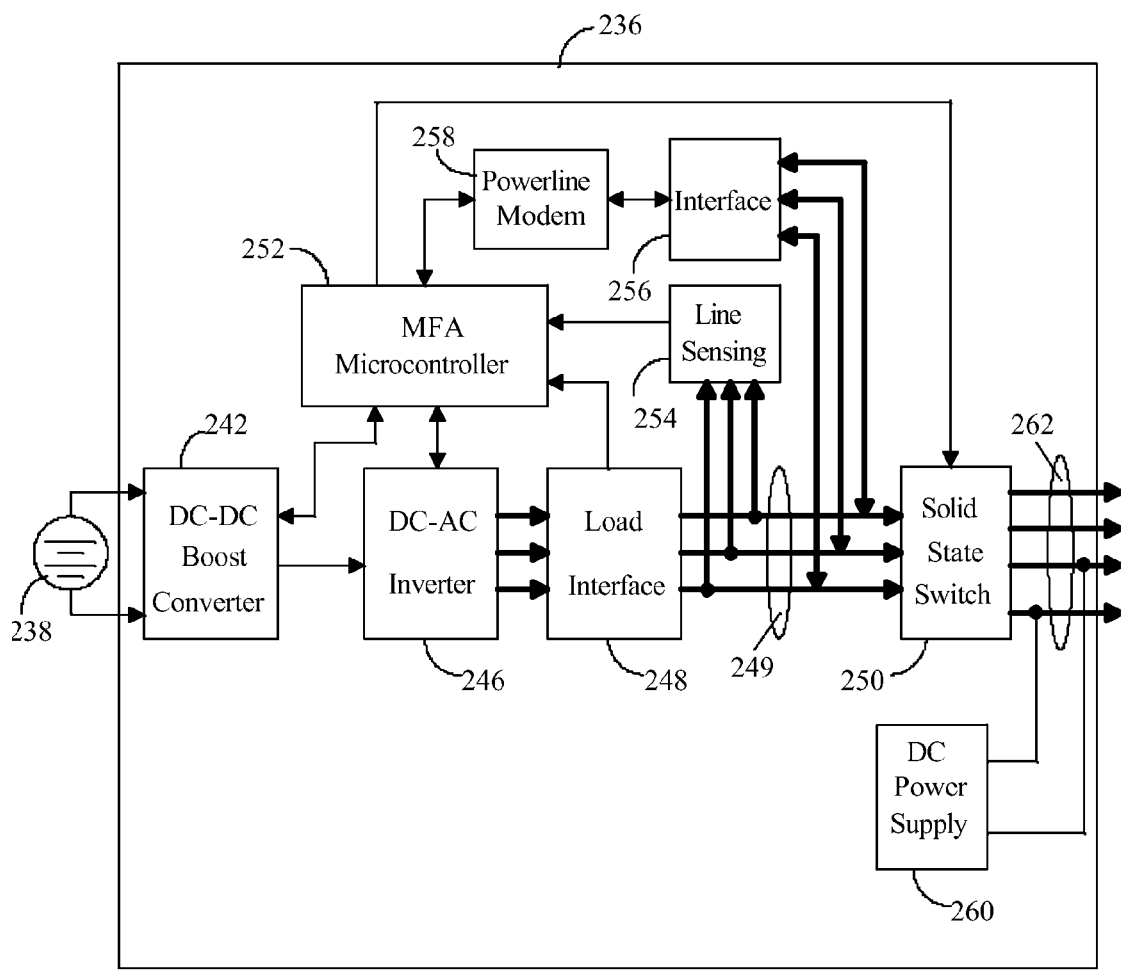
FIG. 11 is a block diagram illustrating a smart single-input three-phase power inverter that inverts the DC power from one DC source to three-phase AC power.

FIG. 11 is a block diagram illustrating a smart single-input three-phase power inverter that inverts the DC power from one DC source to three-phase AC power. The smart three-phase single-input power inverter 236 comprises a DC-DC boost converter 242, a DC-AC inverter 246, a load interface circuit 248, a solid-state switch circuit 250, an MFA microcontroller 252, a line sensing circuit 254, an interface circuit for powerline communications 256, a powerline communications Modem 258, and a DC power supply 260. The power from the DC source 238 is delivered to the DC-DC boost converter 242 and its voltage is increased to a certain value. The DC power is then inverted to three-phase AC power with voltage larger than 208 VAC by the DC-AC inverter 246. The generated AC power goes through the load interface circuit 248 to be combined with the AC power in the internal three-phase AC powerline 249. A solid-state switch 250 controlled by the MFA microcontroller 252 is used to isolate the internal three-phase AC powerline 249 from external three-phase AC powerline 262 when solar power is not being generated. A line sensing circuit 254 connected to the AC powerline 249 is used to detect the phase and zero-crossing point of the incoming three-phase AC power from the power grid. The phase and zero-crossing point signals are sent to the MFA microcontroller 252 for AC power synchronization to assure that the power inverter provides high quality synchronized three-phase AC power to the grid. A powerline communications Modem 258, which is isolated by an interface circuit 256, is used to establish a 2-way digital signal communication between the MFA microcontroller 252 and the outside world through the AC powerline. The external three-phase AC powerline 262 is tapped by a power supply 260 to supply DC power to the electronic components of the power inverter. The MFA microcontroller 252 is used to perform a number of tasks including (i) monitoring the DC boost voltage from the DC-DC boost converter, (ii) controlling the DC-DC boost converter, (iii) performing maximum power point tracking (MPPT) for the DC source, (iv) performing DC-AC inversion and three-phase AC power synchronization, (v) monitoring the three-phase current and voltage for generated power amount and status, (vi) performing powerline communications, (vii) performing logic controls such as three-phase AC powerline switching and isolation.

Figure 12:
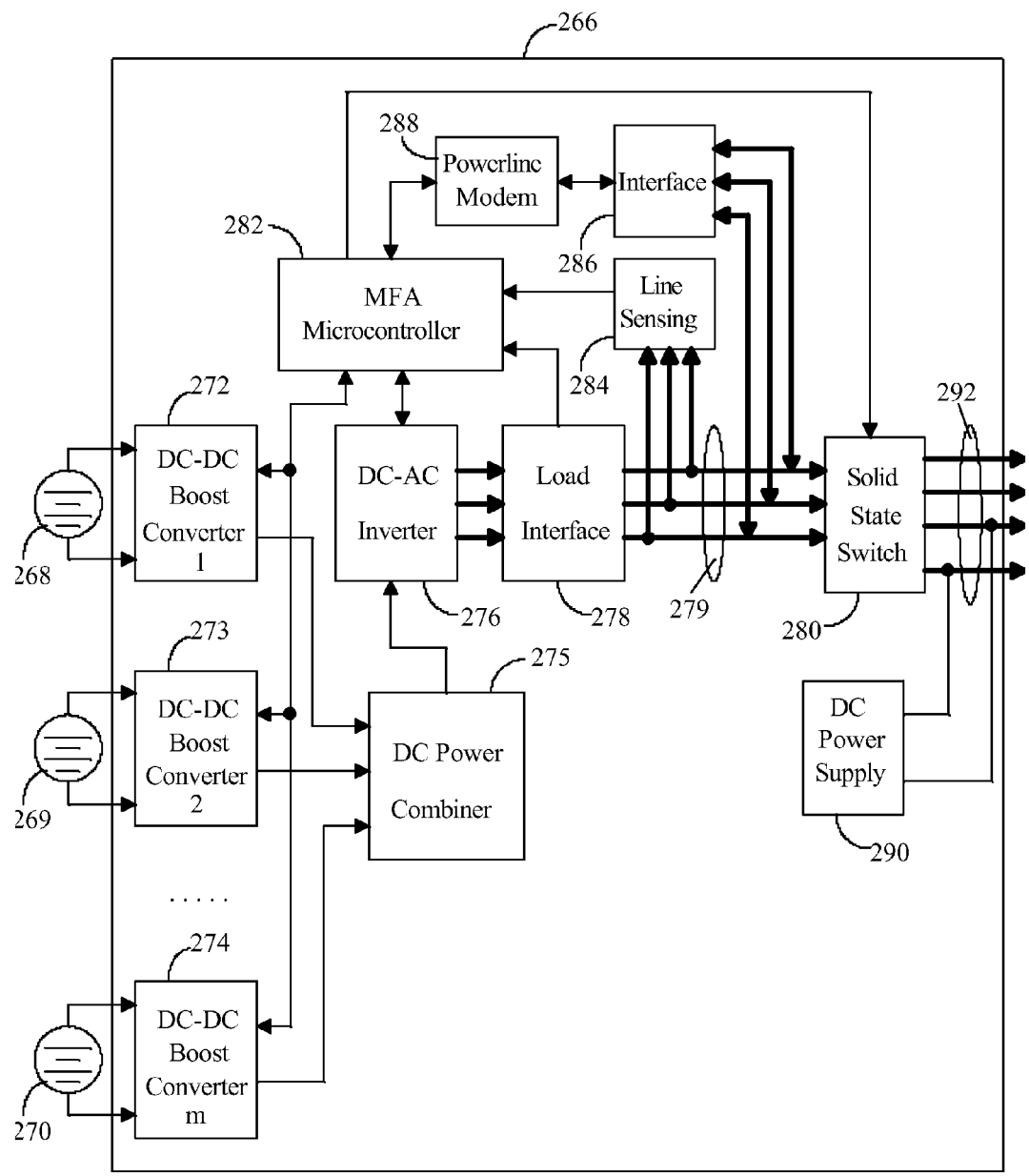
FIG. 12 is a block diagram illustrating a smart multi-input three-phase power inverter that inverts the DC power from multiple DC sources to three-phase AC power.

FIG. 12 is a block diagram illustrating a smart multi-input three-phase power inverter that inverts the DC power from multiple DC sources to three-phase AC power. The smart multi-input three-phase power inverter 266 comprises m DC-DC boost converters 272, 273, . . . , 274, a DC power combiner 275, a DC-AC inverter 276, a load interface circuit 278, a solid-state switch circuit 280, an MFA microcontroller 282, a line sensing circuit 284, an interface circuit for powerline communications 286, a powerline communications Modem 288, and a DC power supply 290. The power from DC sources 268, 269, . . . , 270 is delivered to the corresponding DC-DC boost converters 272, 273, . . . , 274, respectively. The DC power is then combined in the DC power combiner 275. The total combined DC power is inverted to three-phase AC power with voltage larger than 208 VAC by the DC-AC inverter 276. The generated AC power goes through the load interface circuit 278 to be combined with the AC power in the internal three-phase AC powerline 279. A solid-state switch 280 controlled by the MFA microcontroller 282 is used to isolate the internal three-phase AC powerline 279 from the external three-phase AC powerline 292 when solar power is not being generated. A line sensing circuit 284 connected to the AC powerline 279 is used to detect the phase and zero-crossing point of the incoming three-phase AC power from the power grid. The phase and zero-crossing point signals are sent to the MFA microcontroller 282 for AC power synchronization to assure that the power inverter provides high quality synchronized power to the grid. A powerline communications Modem 288, which is isolated by an interface circuit 286, is used to establish a 2-way digital signal communication between the MFA microcontroller 282 and the outside world through the AC powerline. The external three-phase AC powerline 292 is tapped by a power supply 290 to supply DC power to the electronic components of the power inverter. The MFA microcontroller 282 is used to perform a number of tasks including (i) monitoring the DC boost voltage from each DC-DC boost converter, (ii) controlling the DC-DC boost converters, (iii) performing maximum power point tracking (MPPT) for each DC source, (iv) performing DC-AC inversion and three-phase AC power synchronization, (v) monitoring the three-phase current and voltage for generated power amount and status, (vi) performing powerline communications, (vii) performing logic controls such as three-phase AC powerline switching and isolation.

The DC-DC boost converters that can be used in this embodiment are any of a number of well known converters described in the "Power Electronics Handbook" edited by Muhammad H. Rashid, published by Academic Press in 2007, including Buck Converter, Boost Converter, Buck-Boost Converter, Super-Lift Luo Converter, and Cascade Boost Converter. The DC-AC inverters that can be used in this embodiment are any of a number of well known DC-AC inverters described in the same book including Half-Bridge Inverter, Full-Bridge Inverter, Bipolar PWM Inverter, Unipolar PWM Inverter, and Sinusoidal PWM Inverter. The DC combiners used in this embodiment can be designed with a circuit that allow the output from all DC-DC boost converters to connect in parallel so that all DC currents will be added together. The Powerline Modem that can be used in this embodiment can be any of a number of commercially available integrated circuits capable of providing 2-way digital communications through a powerline. Other modules discussed in this embodiment including load interface, solid state switch, line sensing circuit, powerline interface circuit, and DC power supply can be implemented using one or more known combinations of conventional electronic components such as resisters, capacitors, inductors, solid-state switches, transformers, diodes, transistors, operational amplifiers, and ceramic filters, etc.

Figure 13:
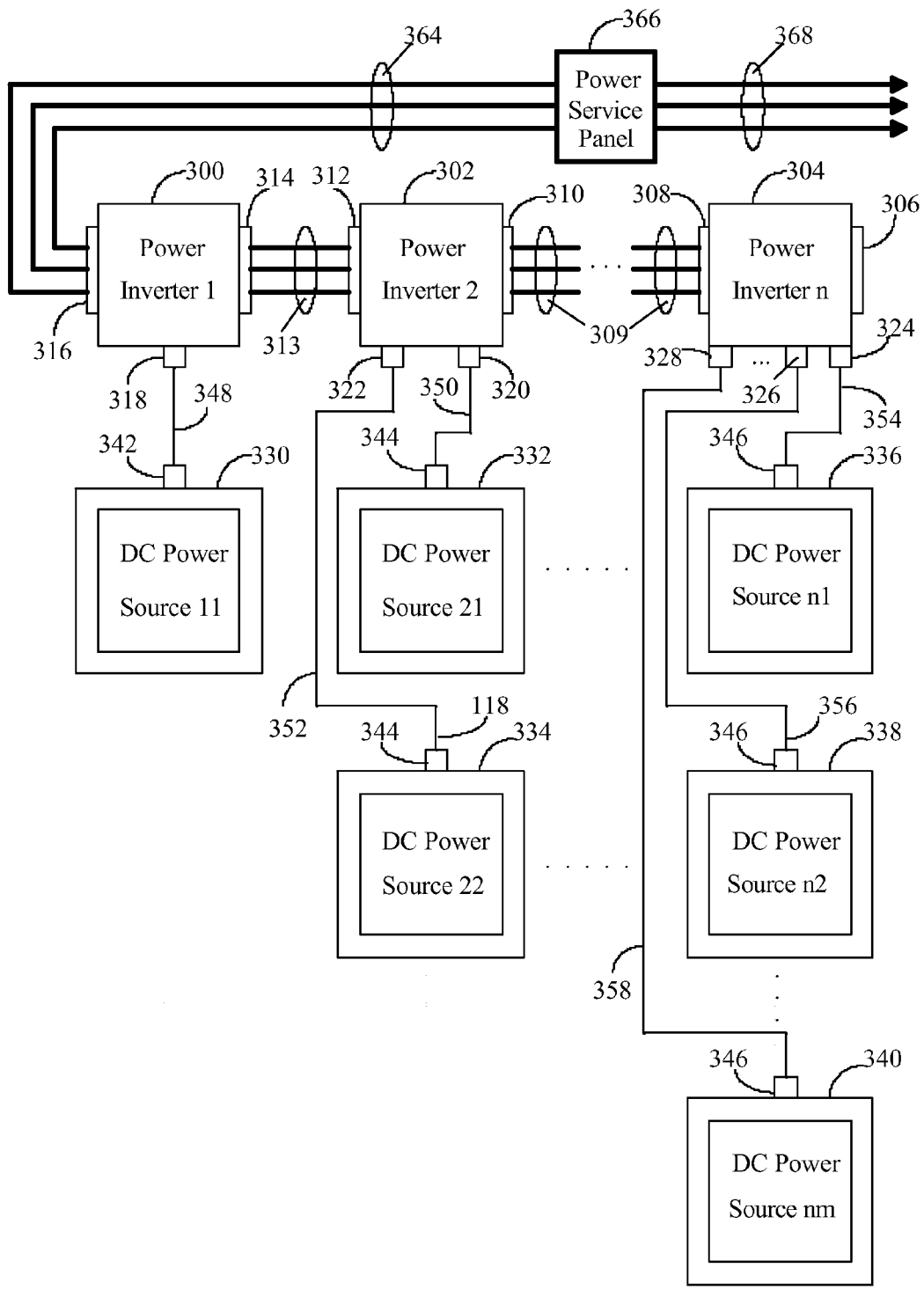
FIG. 13 is a block diagram illustrating a smart power inversion and optimization system where one smart single-input power inverter, one smart dual-input power inverter, and a number of multi-input power inverters in a mixed variety daisy chain to generate single-phase AC power.

FIG. 13 is a block diagram illustrating a smart power inversion and optimization system, where one smart single-input power inverter, one smart dual-input power inverter, and a number of multi-input power inverters in a mixed variety daisy chain to generate single-phase AC power. The system comprises a smart single-input power inverter 300, a smart dual-input power inverter 302, and n−2 smart multi-input power inverters 304. The single-input power inverter 300 inverts DC from one DC source 330 to AC power; the dual-input power inverter 302 inverts DC from two DC sources 332 and 334 to AC power; and the multi-input power inverter 304 inverts DC from multiple DC sources 336, 338, and 340 to AC power. The single-input power inverter 300 connects to DC source 330 through its DC power port 318, DC source's DC connector 342, and a DC cable 348. The dual-input power inverter 302 connects to DC sources 332 and 334 through its DC power ports 320 and 322, DC sources' DC connectors 344, and DC cables 350 and 352, respectively. The multi-input power inverter 304 connects to DC sources 336, 338, and 340 through its DC power ports 324, 326, and 328, DC sources' DC connector 346, and DC cables 354, 356, and 358, respectively.

The smart single-input power inverter comprises an AC input port 314 and an AC output port 316; the smart dual-input power inverter comprises an AC input port 310 and an AC output port 312; and the smart multi-input power inverter comprises an AC input port 306 and an AC output port 308. Without losing generality, within the system, there could be a number of smart power inverters having a mixed variety of inputs. All the smart and scalable power inverters daisy chain, where the first power inverter's AC input port 306 is left open, and the last power inverter's AC output port 316 is connected to a power service panel 366 via the single-phase AC powerline 364. The AC power generated by the system is supplied to the power grid 368.

Figure 14:
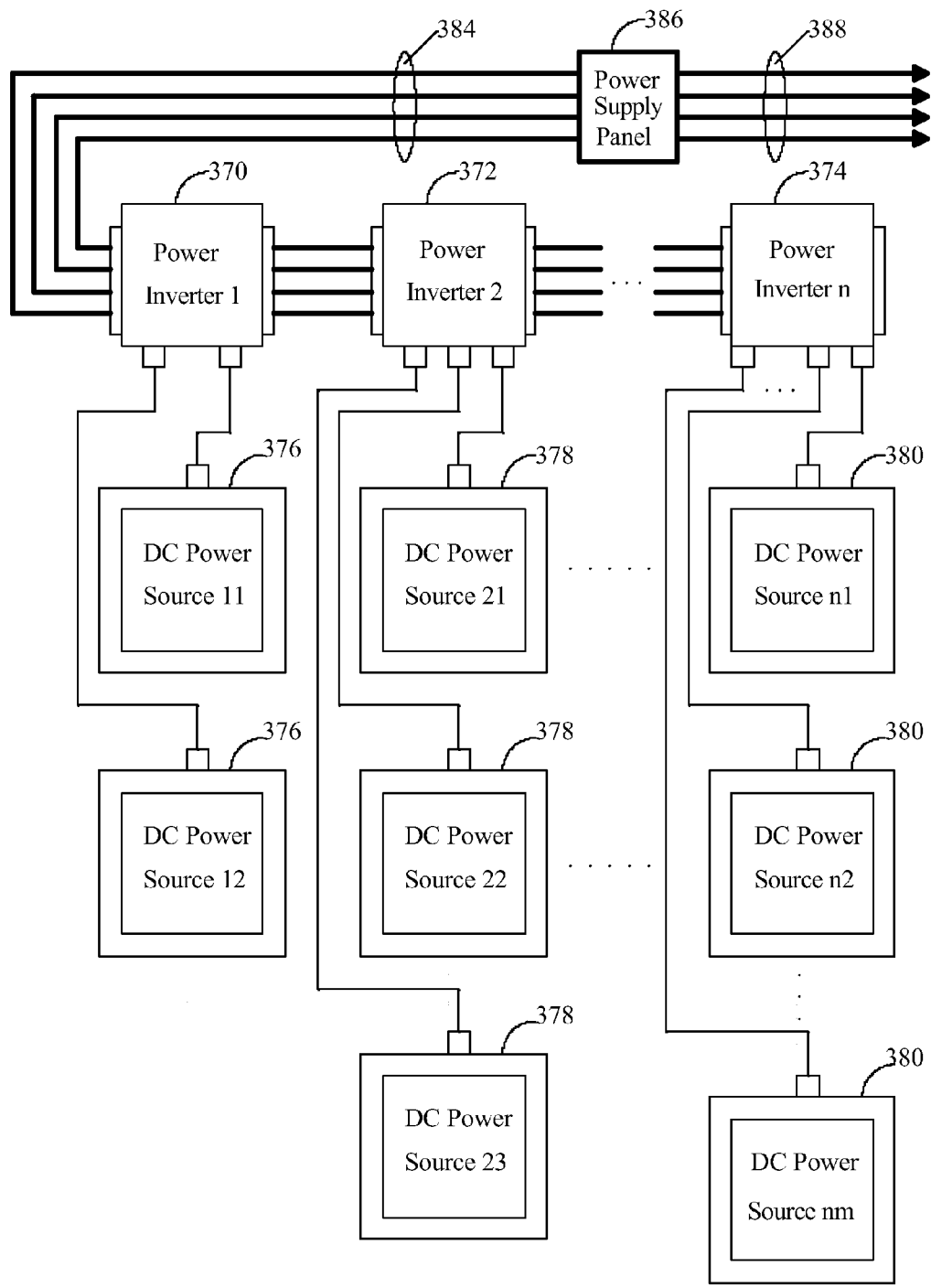
FIG. 14 is a block diagram illustrating a smart three-phase power inversion and optimization system where one smart dual-input power inverter, one smart triple-input power inverter, and a number of smart multi-input power inverters in a mixed variety daisy chain to generate three-phase AC power.

FIG. 14 is a block diagram illustrating a smart power inversion and optimization system where one smart dual-input power inverter, one smart triple-input power inverter, and a number of smart multi-input power inverters in a mixed variety daisy chain to generate three-phase AC power. The system comprises a smart dual-input power inverter 370, a smart triple-input power inverter 372, and n−2 smart multi-input power inverters 374. The dual-input power inverter 370 inverts DC from two DC sources 376 to AC power; the triple-input power inverter 372 inverts DC from three DC sources 378 to AC power; and the multi-input power inverter 374 inverts DC from multiple DC sources 380 to AC power. Without losing generality, within the system, there could be a number of smart power inverters having a mixed variety of inputs. All the smart and scalable power inverters daisy chain, where the first power inverter's AC input port is left open, and the last power inverter's AC output port is connected to a power service panel 386 via the three-phase AC powerline 384. The AC power generated by the system is supplied to the power grid 388.

Figure 15:
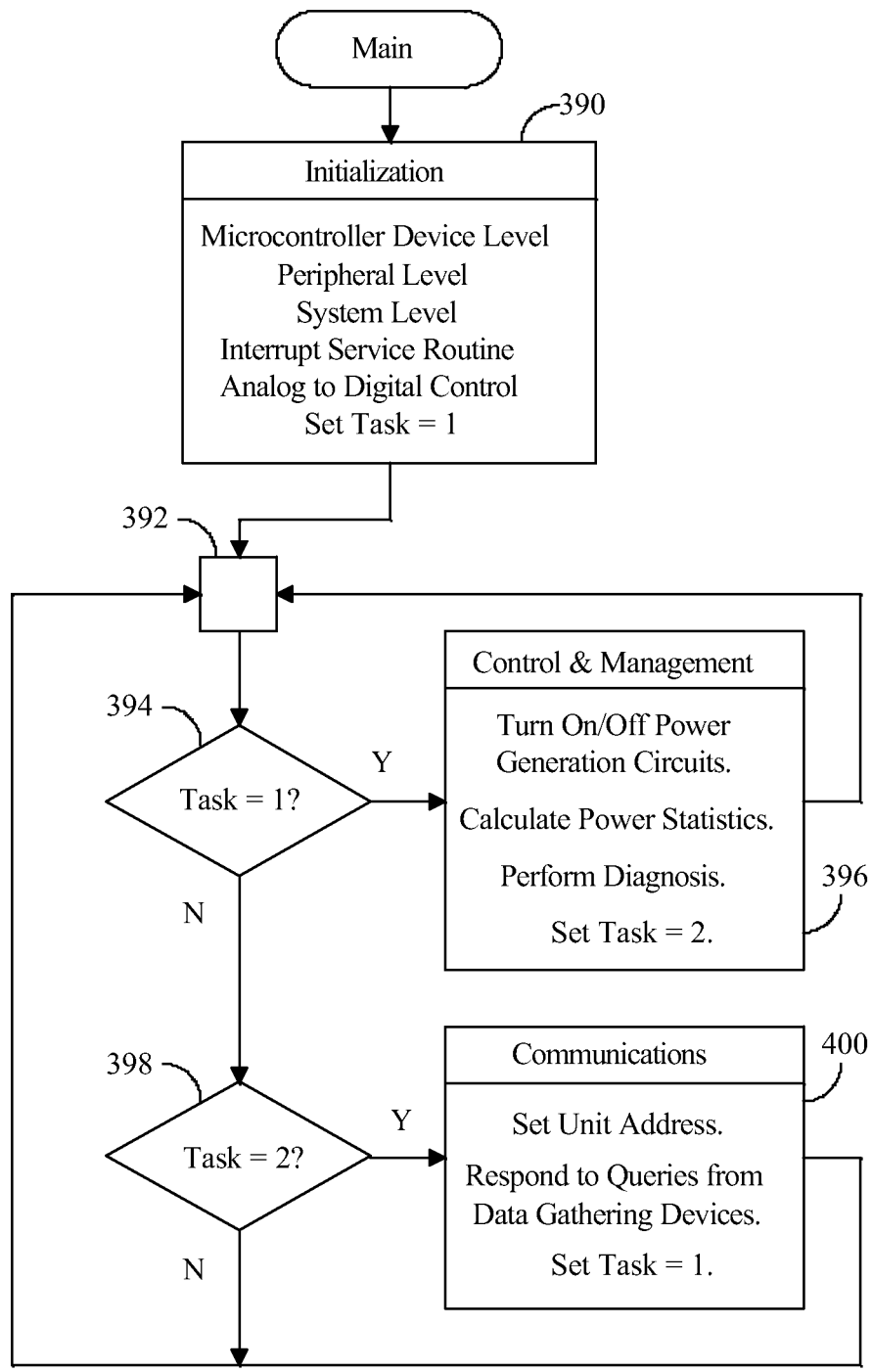
FIG. 15 is a flow chart describing the main software program running in the MFA microcontroller.

FIG. 15 is a flow chart describing the main software program running in the MFA microcontroller. At Block 390, initialization is taking place in the microcontroller device level, peripheral level, system level, and for the interrupt service routine and analog and digital control routines. More specifically, initialization will include but is not limited to setting up registers, I/Os, and timers and enabling interrupts for the interrupt service routine. At the end, it will set Task=1.

In the main program, there are two major tasks. Task 1 is related to the control and management of the smart and scalable power inverter. Task 2 is related to the communications of the power inverter to the outside world through the powerline Modem. After initialization, the main program enters the main loop entry point 392 and then goes to Block 394.

At Block 394, the program checks to see if Task 1 is scheduled to run. If the answer is Yes, the program will execute the functions in Block 396 to (i) turn on/off the power generation circuit based on the DC power source input and conditions of the power inverter and AC powerline, (ii) calculate power statistics such as the amount of power generated during a certain period of time, and (iii) perform system diagnosis. Then, it sets Task=2 and returns to Block 392, which is the entry of the main loop. When the program continues, it will go through Block 394, and reach Block 398. At Block 398, the program checks to see if Task 2 is scheduled to run. If the answer is Yes, the program will execute the functions in Block 400 to (i) set the unit address for the power inverter, and (ii) respond to queries from data gathering or acquisition devices to report the power statistics. Then, it sets Task=1 and returns to Block 392. The main program runs continuously based on a preset loop rate to execute the scheduled tasks. At any time an interrupt is triggered, the microcontroller immediately processes the pending interrupt service routine.

Figure 16:
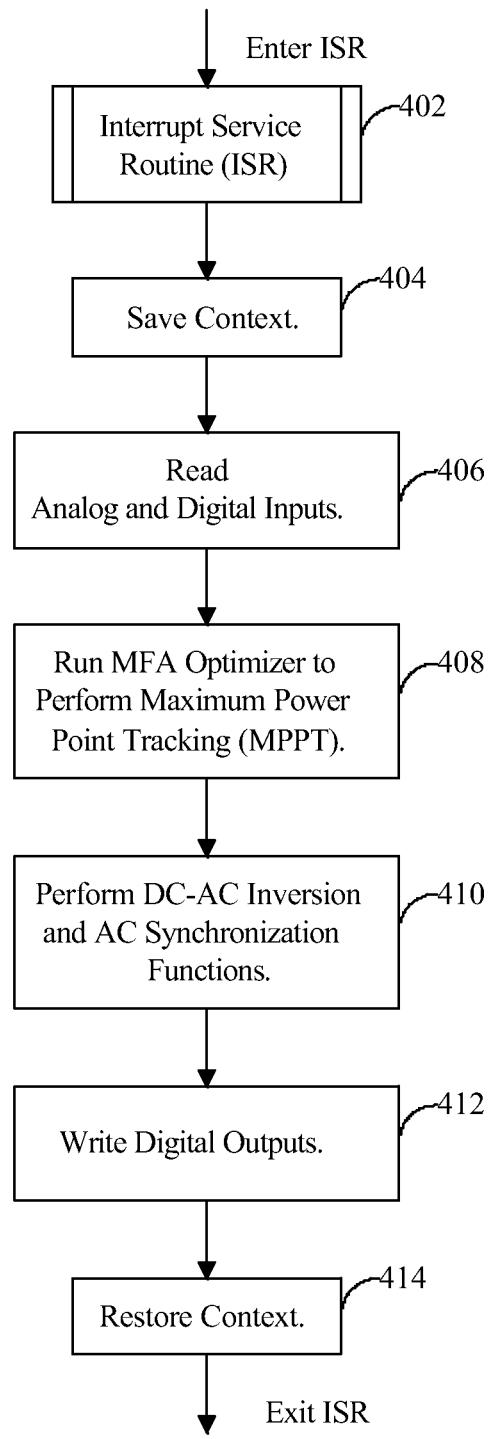
FIG. 16 is a flow chart describing the key components, functions, and steps in the interrupt service routine embedded in the MFA microcontroller.

FIG. 16 is a flow chart describing the key components, functions, and steps in the interrupt service routine embedded in the MFA microcontroller. Block 402 is the entry of the interrupt service routine (ISR). An interrupt service routine is a software routine that the microcontroller invokes in response to an interrupt. All the time-critical functions the microcontroller needs to execute are put inside the ISR to assure these functions are executed in real time. At block 404, the ISR saves the current context of the main program. At Block 406, the ISR reads analog and digital inputs including but not limited to the voltage and current signals from the DC source, DC-DC boost converter, DC-AC inversion circuit, and phase and zero-crossing point of the AC Powerline. At Block 408, the ISR runs the MFA Optimizer to perform Maximum Power Point Tracking (MPPT) for each DC power source. At Block 410, the ISR performs DC-AC inversion and AC synchronization functions. At Block 412, the PWM control signals are sent out through the digital output ports to the corresponding DC-DC boost converter(s) and DC-AC inverter. At Block 414, the ISR restores the saved context of the main program so that the execution of the main program can be resumed. After the ISR exits, the main program continues from the point where it was branched out to execute the interrupt service routine.

The systems described in all the figures of this patent, especially in FIGS. 1, 2, 13 and 14, demonstrate the essence of the scalability of this invention. One can build a small-scale or a very large-scale PV solar power system with various numbers and sizes of the smart and scalable power inverters of this invention. Regardless of the number and types of DC sources that each power inverter can handle, the smart power inverters in the same family can daisy chain producing a total AC power that is the summation of the AC power supplied by each smart power inverter. This "anything goes" design significantly improves the scalability, flexibility, user-friendliness, and return-on-investment (ROI) of renewable energy power generation systems including photovoltaic solar power systems. In addition, an existing system can be easily expanded by installing more solar modules and smart power inverters. This makes the solar power systems attractive to both homeowners and businesses where only limited budgets are available and continued investments can be made to expand the system over time. The disclosed invention could have strategic importance to the renewable energy industry and society.

The invention claimed is:

1. A DC-to-AC power inverter, comprising:
   a) one DC power input port having one DC power source connected thereto;
   b) one AC power output port arranged to supply AC power to the AC power grid;
   c) a DC-DC boost converter connected to said DC power source and arranged to convert the power source voltage to a higher DC voltage suitable for inversion;
   d) a DC-AC inverter connected to said DC-DC boost converter and arranged to invert the DC power to AC power with voltage higher than the incoming AC power voltage;
   e) an internal AC powerline that combines the generated AC power with the external AC power from the AC power grid;
   f) a load interface circuit connected to said DC-AC inverter and to said internal AC powerline, said load interface circuit being arranged to filter high-frequency components out of the said DC-AC inverter's AC output;
   g) an MFA microcontroller connected to said DC-DC boost converter, DC-AC inverter, and load interface circuit, said microcontroller arranged to monitor the DC boost voltage, control the DC-DC boost converter, perform maximum power point tracking (MPPT), perform DC-AC inversion and AC power synchronization, monitor AC current and voltage for generated power amount and status, perform powerline communications, and perform logic controls such as AC powerline switching and isolation;
   h) a powerline modem connected to said microcontroller and said internal AC powerline through an interface circuitry for transmitting and receiving performance data between said microcontroller and said power grid;
   i) a line sensing circuit connected to said internal AC powerline and said microcontroller for detecting the phase and zero-crossing point of the incoming AC power from the power grid; and
   j) a solid state switch connected to said internal AC powerline and external AC powerline, and arranged to disconnect said internal AC powerline from the AC grid during the non-generation time.

2. The inverter of claim 1, in which the output of said inverter is single-phase AC.

3. The inverter of claim 1, in which the output of said inverter is three-phase AC.

4. The inverter of claim 1, in which said MFA microcontroller includes Model-Free Adaptive (MFA) controllers which control the DC-DC boost converter, and MFA optimizers which provide maximum power point tracking (MPPT) to allow the power inverter to achieve optimal power production.

5. A DC-to-AC power inverter, comprising:
   a) at least two DC power input ports, each of said DC power input ports having one DC power source connected thereto;
   b) one AC power output port arranged to supply AC power to the AC power grid;
   c) for each DC power source, a DC-DC boost converter connected to said DC power sources and arranged to convert the power source voltage to a higher DC voltage suitable for inversion;
   d) a DC power combiner connected to said DC-DC boost converters for combining the DC output from all DC-DC boost converters and allowing the said DC-DC boost converters to connect in parallel so that all DC currents are added together;
   e) a DC-AC inverter connected to said DC power combiner and arranged to invert the DC power to AC power with voltage higher than the incoming AC power voltage;
   f) an internal AC powerline that combines the generated AC power with the external AC power from the power grid;
   g) a load interface circuit connected to said DC-AC inverter and to said internal AC powerline, said load interface circuit being arranged to filter high-frequency components out of the said DC-AC inverter's AC output;
   h) an MFA microcontroller connected to said DC-DC boost converters, DC-AC inverter, and load interface circuit, said microcontroller arranged to monitor the DC boost voltage, control the DC-DC boost converter, perform maximum power point tracking (MPPT), perform DC-AC inversion and AC power synchronization, monitor AC current and voltage for generated power amount and status, perform powerline communications, and perform logic controls such as AC powerline switching and isolation;
   i) a powerline modem connected to said microcontroller and said internal AC powerline through an interface circuitry for transmitting and receiving performance data between said microcontroller and said power grid;
   j) a line sensing circuit connected to said internal AC powerline and said microcontroller for detecting the phase and zero-crossing point of the incoming AC power from the power grid; and
   k) a solid state switch connected to said internal AC powerline and external AC powerline, and arranged to disconnect said internal AC powerline from the AC grid during the non-generation time.

6. The inverter of claim 5, in which the output of said inverter is single-phase AC.

7. The inverter of claim 5, in which the output of said inverter is three-phase AC.

8. The inverter of claim 5, in which said MFA microcontroller includes Model-Free Adaptive (MFA) controllers which control the DC-DC boost converters, and MFA optimizers which provide maximum power point tracking (MPPT) to allow the power inverter to achieve optimal power production.

* * * * *